United States Patent
Suglia et al.

(10) Patent No.: US 10,649,035 B2
(45) Date of Patent: May 12, 2020

(54) METHOD FOR ESTIMATING THE CURRENT AND THE STATE OF CHARGE OF A BATTERY PACK OR CELL, WITHOUT DIRECT DETECTION OF CURRENT UNDER OPERATING CONDITIONS

(71) Applicant: MAGNETI MARELLI S.p.A., Corbetta (IT)

(72) Inventors: Rosanna Suglia, Bologna (IT); Danilo Pritelli, Bologna (IT); Gianluca Aurilio, Bologna (IT)

(73) Assignee: MAGNETI MARELLI S.p.A., Corbetta (IT)

( * ) Notice: Subject to any disclaimer, the term of this patent is extended or adjusted under 35 U.S.C. 154(b) by 49 days.

(21) Appl. No.: 15/985,926

(22) Filed: May 22, 2018

(65) Prior Publication Data
US 2018/0340981 A1    Nov. 29, 2018

(30) Foreign Application Priority Data
May 29, 2017   (IT) ........................ 102017000058171

(51) Int. Cl.
*H02J 7/00*   (2006.01)
*G01R 31/3842*   (2019.01)
(Continued)

(52) U.S. Cl.
CPC ....... *G01R 31/3842* (2019.01); *G01R 31/367* (2019.01); *G01R 31/374* (2019.01);
(Continued)

(58) Field of Classification Search
CPC .. G01R 31/3842; G01R 31/392; H02J 7/0047
(Continued)

(56) References Cited

U.S. PATENT DOCUMENTS 8,242,738 B2   8/2012 Barsukov
2006/0202857 A1*   9/2006 Kawahara .......... G01R 31/3648
340/870.02

(Continued)

FOREIGN PATENT DOCUMENTS

EP   2551687 A1   1/2013
EP   3002597 A1   4/2016

OTHER PUBLICATIONS

Search Report for Italian Patent Application No. 201700058171 dated Mar. 2, 2018.
(Continued)

*Primary Examiner* — Zixuan Zhou
(74) *Attorney, Agent, or Firm* — Howard & Howard Attorneys PLLC

(57) ABSTRACT

A method for estimating an operating current I dispensed by a battery pack or cell including the steps of acquiring characterization data of the battery pack or cell, related to measured time trends of a voltage Vm and of a characterization current Im of the battery pack or cell, associated with a respective characterization temperature value $T_k$; and then processing the characterization data to determine a plurality of parameters P of a model of the battery pack or cell, as a function of temperature and state of charge SOC. Measuring an operating voltage V of the battery pack or cell and an operating temperature T and for estimating the operating current I of the battery pack or cell. A plurality of time observation windows $W_i$ is identified and characterization voltage $Vm_i$ values are detected. Then, at each observation window $W_i$, the following actions are performed: calculating a value of the state of charge $SOC_i$ of the battery pack or cell; calculating an estimated voltage $V_{ABi}$, by means of the model of the battery pack or cell, as a function of respective nominal values of the parameters P; determining a respective error function $E_i$ dependent on the difference between (Continued)

the estimated voltage $V_{ABi}$ and the characterization voltage $Vm_i$ of the time observation window $W_i$; calculating an actual value $P_i$ for each parameter P, by minimizing the aforesaid error function $E_i$.

18 Claims, 17 Drawing Sheets

(51) Int. Cl.
    *G01R 31/392*     (2019.01)
    *G01R 31/367*     (2019.01)
    *G01R 31/374*     (2019.01)
    *G01R 31/3835*     (2019.01)
    *G01R 31/389*     (2019.01)

(52) U.S. Cl.
    CPC .......... *G01R 31/392* (2019.01); *H02J 7/0047* (2013.01); *G01R 31/389* (2019.01); *G01R 31/3835* (2019.01)

(58) Field of Classification Search
    USPC ........................................ 320/106, 144, 153
    See application file for complete search history.

(56) References Cited

U.S. PATENT DOCUMENTS

2015/0357852 A1   12/2015   Nakao et al.
2016/0124051 A1    5/2016   Prasad et al.
2016/0187427 A1    6/2016   Jeon

OTHER PUBLICATIONS

Cho, Sungwoo, et al., "State-of-charge estimation for lithium-ion batteries under various operating conditions using an equivalent circuit model," Computers and Chemical Engineering, vol. 41, pp. 1-9 (Feb. 3, 2012).

He, Hongwen, et al., "Evaluation of Lithium-Ion Battery Equivalent Circuit Models for State of Charge Estimation by an Experimental Approach," Energies, vol. 4, No. 12, pp. 582-598 (Dec. 1, 2011).

* cited by examiner

METHOD FOR ESTIMATING THE CURRENT AND THE STATE OF CHARGE OF A BATTERY PACK OR CELL, WITHOUT DIRECT DETECTION OF CURRENT UNDER OPERATING CONDITIONS

CROSS-REFERENCE TO RELATED APPLICATIONS

The present application claims priority to and all the benefits of Italian Patent Application No. 102017000058171, filed on May 29, 2017, which is hereby expressly incorporated herein by reference in its entirety.

BACKGROUND OF THE INVENTION

1. Field of the Invention

The present invention relates to the technical sector of electronic methods and systems for controlling an electric apparatus.

In particular, the invention relates to methods for estimating the operating current and the state of charge of a battery or a battery pack for a vehicle or, likewise, of a battery cell (simply defined in this description as "cell"), without direct detection of current under operating conditions.

Furthermore, the invention relates to a control device of a battery pack or cell, which performs the aforesaid method, and a battery pack or cell for a vehicle capable of monitoring the operating current and the state of charge, by virtue of the aforesaid method, without need to be equipped with current sensors.

2. Description of the Related Art

Knowing the voltage and electric current of a battery, of a battery pack or cell composed of electrochemical cells (in particular, in the "automotive" field, in the context of motion systems and batteries for electric or hybrid drive vehicles) is a very important information for the correct management and control of the battery, battery pack or cell.

The acquisition of voltage, current and temperature of the cells of a battery pack or cell is required for knowing the state of charge of the cell itself, and for the correct management and protection thereof, so as to avoid the triggering of secondary physical-chemical processes which would lead to the degradation of performance and durability of the cell, and even, in extreme cases, to the phenomenon known as "thermal runaway", with serious consequences, up to the blaze or explosion of the battery pack or cell.

Furthermore, knowing the current, which may be common to several modules or to the whole battery pack or cell, is useful for determining the state of charge (SOC) of the cell.

In common background art solutions, knowing the battery or cell current is obtained by the direct detection of such current, typically using physical current sensors of the shunt type or Hall-effect-based sensors, installed on the battery pack or cell itself.

In the case of shunt type sensors, the current is determined by measuring the voltage on a resistor with a known value on which the battery or cell current is circulated.

In the case of Hall-effect-based sensors, the current is determined by measuring the Hall voltage generated on a conductor crossed by the current of the battery or cell and subjected to an electromagnetic field.

Both of the aforementioned cases envisage the need to provide a battery pack or cell equipped with a plurality of current sensors, which entails the disadvantage of increasing the complexity and cost of the battery pack itself or of the cell.

The need therefore arises to identify methods for estimating the current of the battery or cell (i.e., the "battery or cell current"), regardless of the direct acquisition of such current using current sensors.

This approach, however, encounters the further technical problem of obtaining a current estimate sufficiently accurate to be actually usable. In fact, the required accuracy provides for minimizing the error of the estimate within limited percentages (for example, comparable to or less than 5%).

A battery or cell current estimate of such accuracy is not at all easy to obtain, since the actual battery or cell current, at a given moment, not only depends on the battery or cell operating voltage detected at that instant, but also depends, in a complex manner, on the temperature and the state of charge of the battery or cell (hence on the history and life-time thereof). Therefore, there are no simple analytical formulas which, by knowing the battery or cell voltage and temperature, allow to obtain the battery or cell current, with the accuracy required.

Furthermore, since the relationship between the battery or cell current and the other electrical and thermal quantities of the battery or cell also depends on degradation and aging, the need is further felt to have an estimation method which suitably takes into account such aspects.

The known solutions, in this regard, do not satisfy the requirements mentioned above.

In light of the foregoing, mainly in the field of automotive applications, and in particular in the context of battery packs for electric or hybrid vehicles, the need is felt for methods for estimating the current and the state of charge of the battery or cell, providing a sufficiently accurate information regarding the current and regarding the state of charge of the battery or cell, while avoiding the need for a direct acquisition of the battery or cell current under operating conditions.

SUMMARY OF THE INVENTION

It is the object of the present invention to provide a method for estimating the operating current and the state of charge of a battery pack or cell, capable of providing a sufficiently accurate estimate of the current and of the state of charge of the battery or cell, without requiring a direct acquisition of the current itself, such as to allow, at least partially, to overcome the drawbacks indicated above with reference to the background art, and to fulfill the abovementioned requirements particularly felt in the technical sector considered.

In particular, the present invention aims to provide a method for determining the battery or cell current by measuring only the voltage at the ends of the battery or cell when this is crossed by electric current, without having to employ a physical current sensor of the shunt or Hall-effect type. Thereby, it is possible to completely manage the battery pack or cell by only measuring directly the voltage at the ends of the battery or cell, thus determining the current from the voltage measurement and from a characterization of the internal resistance thereof as a function of different variables, including temperature and aging.

The object is achieved by a method for estimating an operating current (I) dispensed by a battery pack or cell, comprising the steps of: acquiring characterization data of the battery pack or cell, related to measured time trends of a characterization voltage (Vm) and of a characterization current (Im) of the battery pack or cell, each time trend being associated with a respective value of a plurality of characterization temperature values ($T_k$); processing the characterization data to determine a plurality of parameters (P) of an operating model of the battery pack or cell, as a function of temperature and state of charge (SOC) of the battery pack or cell; while the battery pack or cell is under operating conditions, measuring an operating voltage (V) of the battery pack or cell and an operating temperature (T); estimating the operating current (I) of the battery pack or cell, by using said operating model, based on the measured operating voltage (V), on the measured operating temperature (T) and on said plurality of parameters (P). The processing step comprises the following stages, performed for each value of said plurality of characterization temperature values ($T_k$): identifying a plurality of time observation windows ($W_i$) along the respective time trends of the characterization voltage (Vm) and of the characterization current (Im), associated with the characterization temperature ($T_k$), and detecting the respective characterization current ($Im_i$) and characterization voltage ($Vm_i$) values; at each observation window ($W_i$), calculating a respective value of the state of charge ($SOC_i$) of the battery pack or cell; at each observation window ($W_i$), calculating a respective estimated voltage ($V_{ABi}$), by using the operating model of the battery pack or cell, as a function of respective nominal values of the parameters (P), and determining a respective error function ($E_i$) dependent on the difference between the estimated voltage ($V_{ABi}$) and the characterization voltage ($Vm_i$) of the time observation window ($W_i$); at each observation window ($W_i$), calculating an actual value ($P_i$) for each of the plurality of parameters (P) of the model of the battery pack or cell, by minimizing said error function ($E_i$); associating the actual values ($P_i$) of the parameters calculated at the observation windows ($W_i$) with the respective state of charge ($SOC_i$) and characterization temperature ($T_k$), to obtain said plurality of parameters (P) as a function of temperature and state of charge of the battery pack or cell.

The present invention is also directed toward a method for estimating the state of charge (SOC) of a battery pack or cell. The method comprising the steps of: estimating the operating current (I) dispensed by a battery pack or cell, along an operating time of the battery pack or cell, as set forth above; estimating the state of charge (SOC) of the battery pack or cell from an initial state of charge (SOCo), based on the estimated time trend of the operating current (I), starting from an operation start-up instant of the battery pack or cell up to a current instant.

In addition, the present invention is also directed toward a battery pack or cell control device used to control the battery pack or cell even in the absence of an integrated current sensor. The device receives a measured operating voltage (V) value of the battery pack or cell and a measured operating temperature (T) value of the battery pack or cell. The device comprises electronic processor to perform a method of estimating the battery pack or cell operating current (I), as described above, and/or to carry out a method of estimating the state of charge (SOC) of the battery pack or cell as also described above. A battery pack or cell may also operate without being equipped with integrated current sensors, comprising: a voltage sensor, that detects an operating voltage (V) of the battery pack or cell; a temperature sensor, that detects an operating temperature (T) of the battery pack or cell; a control device as described above.

BRIEF DESCRIPTION OF THE DRAWINGS

Further features and advantages of the method for estimating the current and of the method for estimating the state of charge in accordance with the invention, and of the related control device and battery pack or cell, will become apparent from the following description of preferred embodiments, given by way of indicative and non-limiting example, with reference to the accompanying Figures, in which.

DETAILED DESCRIPTION OF THE INVENTION

Figure 1:
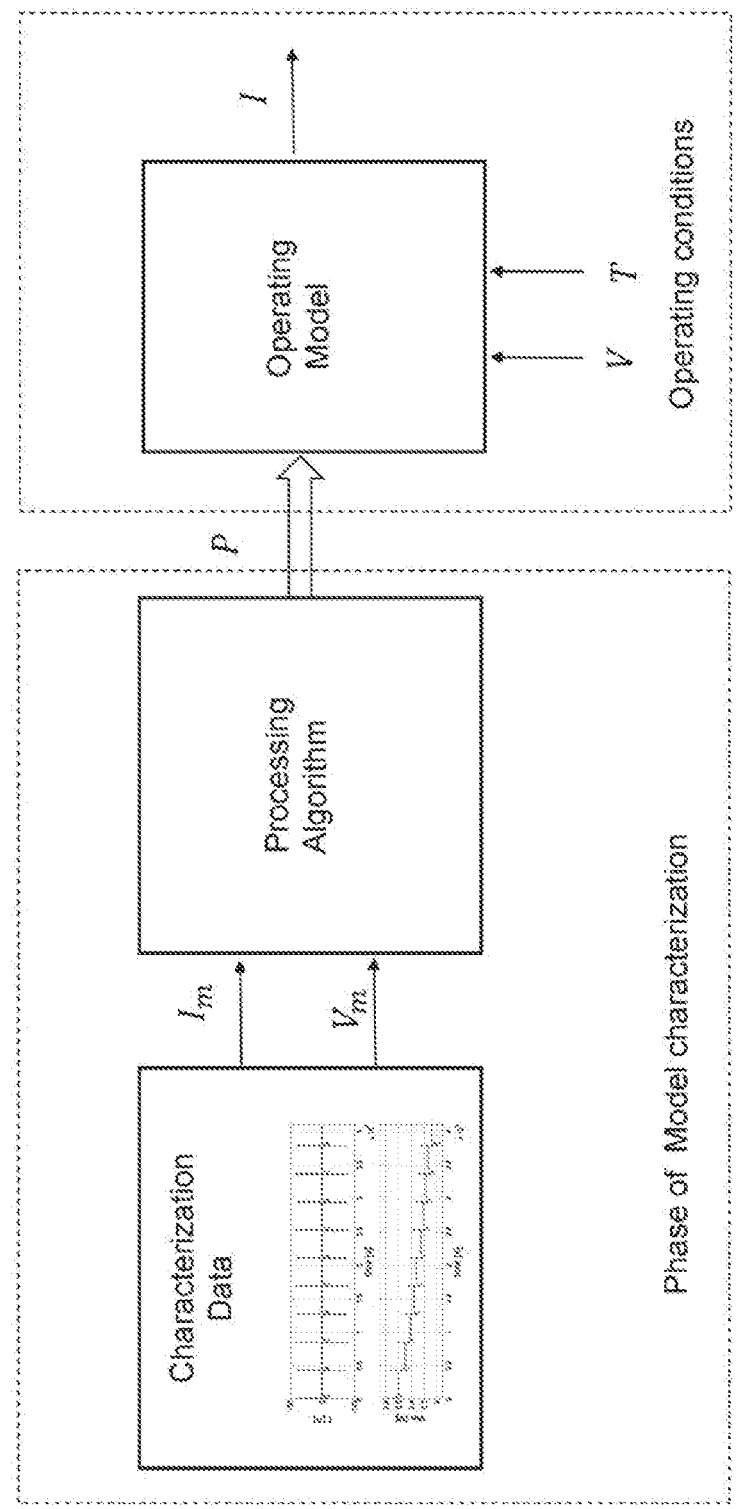
FIG. 1 is a block diagram showing an embodiment of the estimation method in accordance with the present invention.

With reference to FIGS. 1-15, a method for estimating an operating current I dispensed by a battery pack or cell is now described.

The method firstly comprises the step of acquiring characterization data of the battery pack or cell, related to measured time trends of a characterization voltage Vm and of a characterization current Im of the battery pack or cell. Each of the aforesaid time trends is associated with a respective value of a plurality of characterization temperature values $T_k$.

The method further provides for processing the aforesaid characterization data to determine a plurality of parameters P of an operating model of the battery pack or cell, as a function of temperature and state of charge SOC of the battery pack or cell.

Then, while the battery pack or cell is under operating conditions, the method provides for measuring an operating voltage V of the battery pack or cell and an operating temperature T, and estimating the operating current I of the battery pack or cell, using the aforesaid operating model, based on the measured operating voltage V, on the measured operating temperature T and on the aforesaid plurality of parameters P (as previously determined as a function of temperature and state of charge of the battery pack or cell).

It should be noted that the operating current I is the instantaneous current flowing in the battery pack or cell when the instantaneous operating voltage of the battery or cell V and the instantaneous temperature T are detected. Such operating current I is therefore estimated based on the aforesaid parameters T, V and P.

The parameters P are, in turn, obtained by a further processing, based on the temperature and the state of charge SOC of the battery pack or cell, as already noted above and as detailed below.

In the method described herein, the processing step comprises some stages, performed for each value of the aforesaid plurality of characterization temperature values $T_k$.

In particular, the processing step includes identifying a plurality of time observation windows $W_i$ along the respective time trends of the characterization voltage Vm and of the characterization current Im, associated with the characterization temperature $T_k$, and detecting the respective characterization current $Im_i$ and characterization voltage $Vm_i$ values.

Therefore, at each observation window $W_i$, the method provides for calculating a respective value of the state of charge $SOC_i$ of the battery pack or cell.

Still at each observation window $W_i$, the method provides for calculating a respective estimated voltage $V_{ABi}$, using the operating model of the battery pack or cell, as a function of respective nominal values of the parameters P, and determining a respective error function $E_i$ dependent on the difference between the estimated voltage $V_{ABi}$ and the characterization voltage $Vm_i$ of the time observation window $W_i$.

Still at each observation window $W_i$, the method provides for calculating an actual value $P_i$ for each of the plurality of parameters P of the model of the battery pack or cell, by minimizing the aforesaid error function $E_i$.

Finally, the step of associating the actual values $P_i$ of the parameters, calculated at the observation windows $W_i$, with the respective state of charge $SOC_i$ and characterization temperature $T_k$, is provided for, to obtain the aforesaid plurality of parameters P as a function of temperature and state of charge SOC of the battery pack or cell.

According to an embodiment of the method, the aforesaid step of processing the characterization data further provides for determining a respective of no-load voltage $Voc_i$ value of the battery pack or cell, at each observation window $W_i$, and for defining a relationship between no-load voltage Voc and state of charge SOC of the battery pack or cell, based on the plurality of no-load voltages $Voc_i$ and state of charge $SOC_i$ values obtained at the observation windows $W_i$.

In such case, in each observation window $W_i$, the step of calculating the actual value $P_i$ of the parameters also takes into account the respective no-load voltage $Voc_i$ value and the relationship which has been determined between no-load voltage Voc and state of charge SOC of the battery pack or cell.

According to a particular embodiment, the step of identifying a plurality of observation windows $W_i$ comprises identifying time windows where the characterization current Im is zero, upon the exhaustion of transient phenomena, and where, consequently, the no-load voltage $Voc_i$ corresponds to the characterization voltage $Vm_i$.

According to a particular embodiment, the step of calculating a value of the state of charge of the battery pack or cell comprises calculating the respective value of the state of charge ($SOC_i$) of the battery pack or cell based on the time trend of the characterization current. In accordance with different possible embodiments of the method, different operating models of the battery pack or cell may be used.

According to a typical embodiment of the method, the operating model of the battery pack or cell is an electric circuit model. In such case, the model parameters comprise electric circuit parameters.

Figure 2:
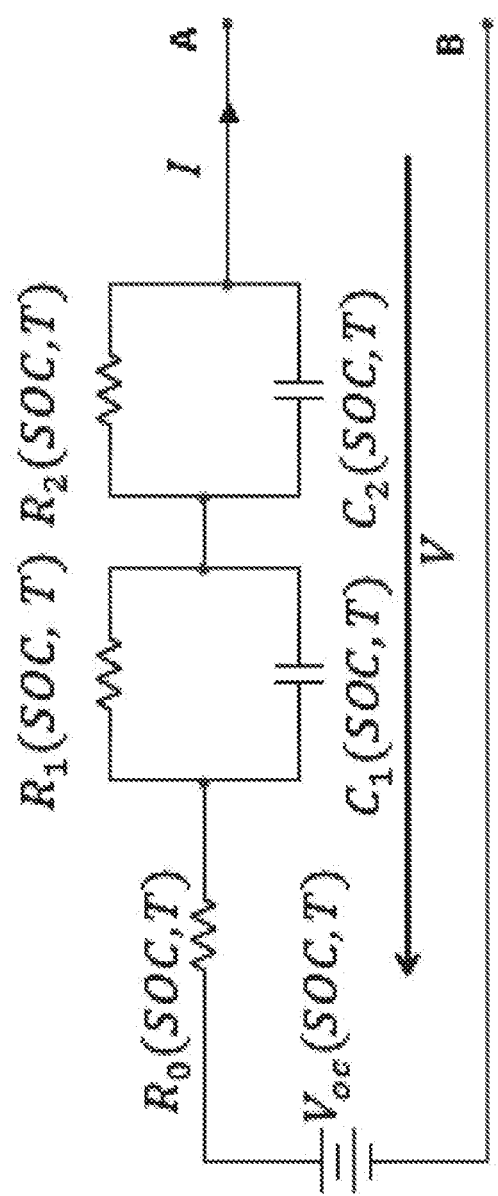
FIG. 2 shows a diagram of an electric model of the battery or cell, adopted in an embodiment of the method in accordance with the invention.

In the example shown in FIG. 2, the electric circuit model of the battery pack or cell comprises a no-load voltage Voc generator and a battery or cell internal resistance $R_0$ arranged in series with one or more circuit groups, each comprising the parallel of a circuit group resistance and of a circuit group capacity. In such case, the group of circuit parameters P comprises no-load voltage Voc, battery or cell internal resistance $R_0$, one or more circuit group resistances $R_1$, $R_2$, and one or more circuit group capacities $C_1$, $C_2$.

In particular, the example of FIG. 2 shows a second order model (typically used to have an accurate and, at the same time, relatively simple modeling), i.e., a model comprising two circuit groups. In such a case, the group of circuit parameters P comprises a first circuit group resistance $R_1$, a first circuit group capacity $C_1$, a second circuit group resistance $R_2$, a second circuit group capacity $C_2$, in addition to the battery or cell internal resistance $R_0$ and the no-load voltage Voc.

It should be noted that the method may provide for the use of other types of models, even non-circuit models, characterized by a certain number of parameters, even non-circuit parameters.

In one embodiment, for example, the operating model of the battery pack or cell comprises a trained predictive algorithm, and the parameters P are parameters of the trained predictive algorithm. In such case, the step of determining the plurality of parameters P comprises training the predictive algorithm according to the acquired battery pack or cell characterization data.

For example, a neural network with N parameters may be used.

Returning to the example of the electric circuit model (for example, the one shown in FIG. 2), it should be noted that the model parameters (Voc, $R_0$, $R_1$, $R_2$, $C_1$, $C_2$) are functions of the state of charge SOC and of the temperature.

The relationship between voltage, current and temperature is expressed by the following formula [1]:

$$V_{AB}(t) = V_{0C} - R_0 \cdot I(t) - R_1 \cdot \left( I(t) - \frac{d(C_1 \cdot V_1)}{dt} \right) - R_2 \cdot \left( I(t) - \frac{d(C_2 \cdot V_2)}{dt} \right)$$

in which the voltage $V_{AB}(t)$ represents the voltage at the terminals of the battery cell or cell and I(t) is the electric current circulating in the cell.

Temperature dependence is implicit since it is included in the parameters (Voc, $R_0$, $R_1$, $R_2$, $C_1$, $C_2$), each of which depends on the temperature.

The electric power and the energy dissipated due to the Joule effect are expressed by the following formulas [2]:

$$P_e = R_0 \cdot I^2 + R_1 \cdot I_{R_1}^2 + R_2 \cdot I_{R_2}^2$$

$$E_e = \int_{t_0}^{t_1} P_e dt$$

As already noted above, the electric parameters depend on the temperature, and further depend, especially the no-load voltage Voc, on the state of charge of the battery cell or cell.

To effectively use the model, it is therefore necessary to characterize the parameters with respect to different state of charge SOC and temperature T values.

To this end, the step of processing the characterization data is provided for, already described above in general terms.

Further details are provided hereby on the algorithm employed in the processing step, with reference to the embodiment of the method in which the electric circuit model of FIG. 2 is used.

Figure 3:
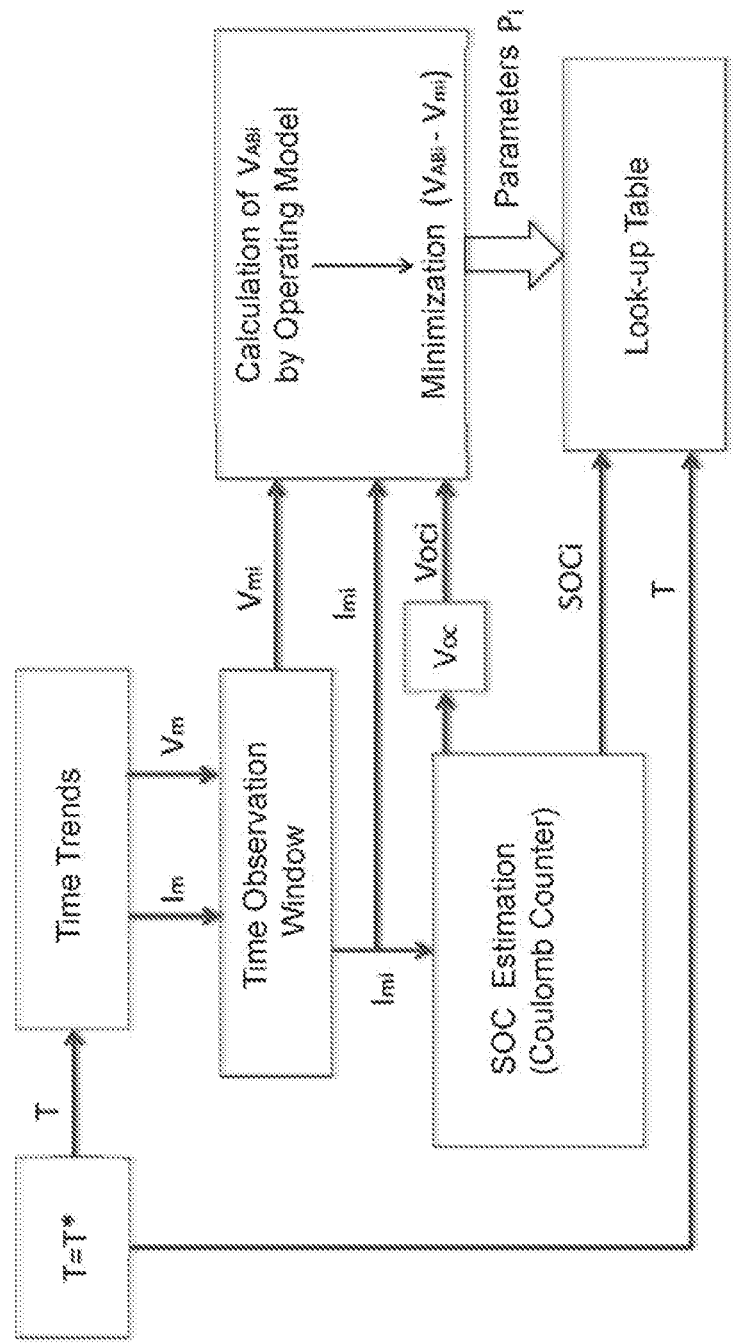
FIG. 3 is a block diagram showing a processing algorithm employed in an embodiment of the method.

Such example of processing algorithm is diagrammatically shown in FIG. 3.

It is assumed to have K time trends, i.e., voltage and current trends, corresponding to K different predefined and set temperatures. For k=1 the first temperature is set ($T_k=T_l$) and the voltage and current time trends, acquired on the battery or cell at a temperature $T_l$, are selected.

The time trends of voltage and current are, for example, acquired in an "off-line" characterization step of the battery or cell. Therefore, such voltage and such current respectively correspond to the "characterization voltage Vm" and to the "characterization current Im", defined above.

Figure 4A:
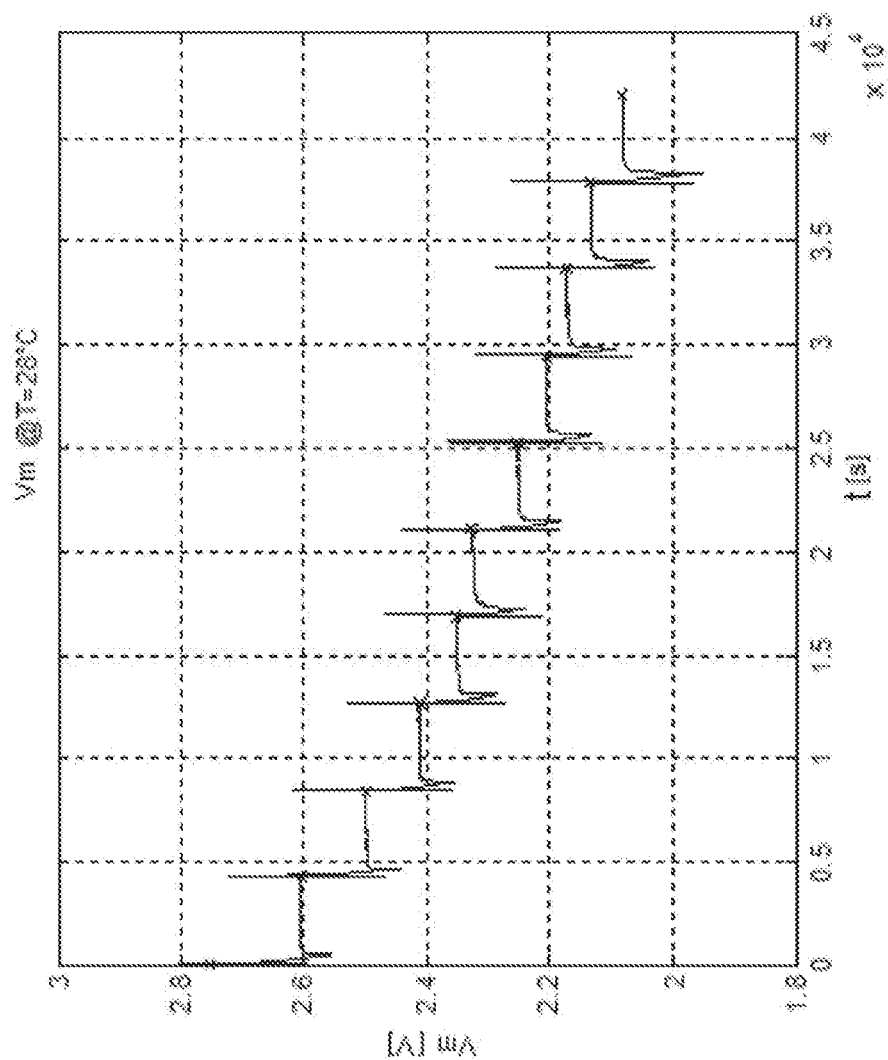
FIGS. 4A and 4B show measured time trends of a voltage and of a characterization current, respectively, of a battery pack or cell, which may constitute input data for the method.
Figure 4B:
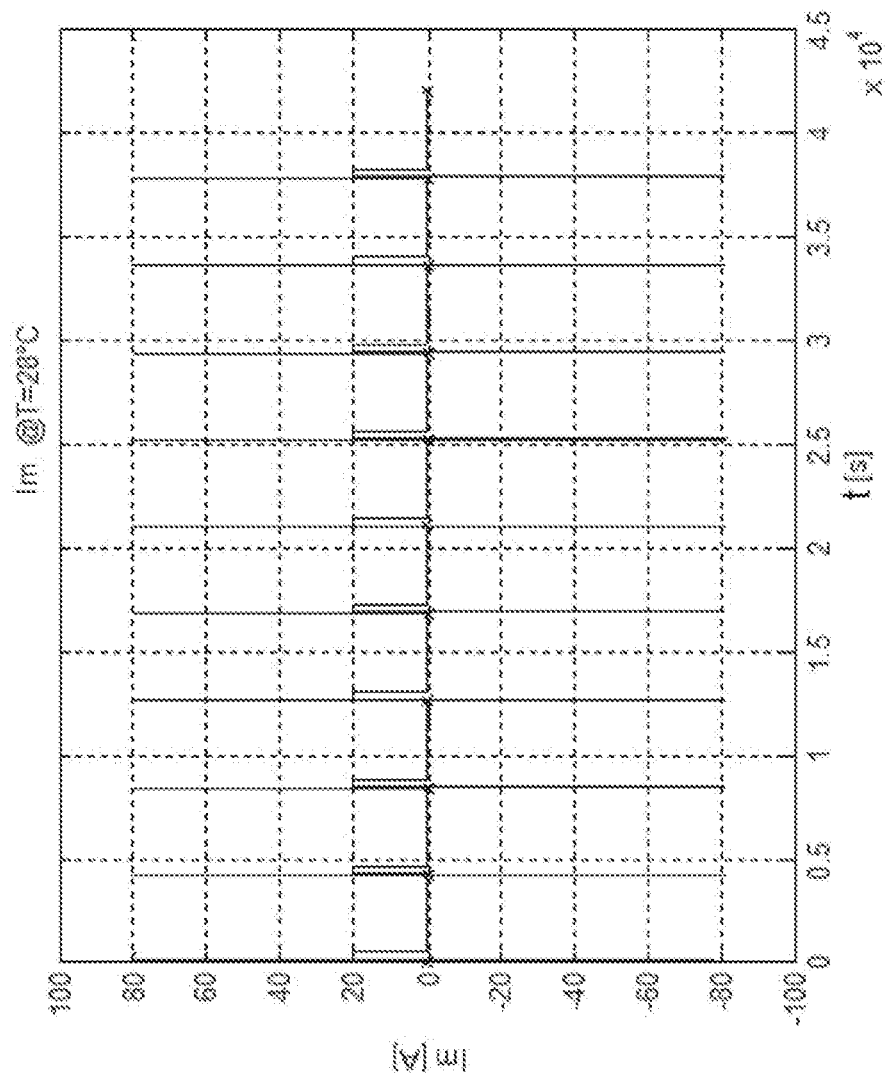

Examples of time trends of characterization voltage Vm and characterization current Im are shown in FIGS. 4A and 4B, respectively, in the case of a 20 Ampere Hour (Ah) Lithium Titanate (LTO) battery cell or cell at a temperature of 28° C.

In the aforesaid time trends of Vm and Im, time observation windows $W_i$ are identified in which the current is zero and remains at a zero value for a time interval such as to allow to consider as concluded the dynamics of the cell itself, i.e., in a condition in which the capacities $C_1$ and $C_2$ of the circuit model have been significantly discharged. In FIGS. 4A and 4B, the ends of the observation windows $W_i$ are indicated by "X" marks.

Figure 5A:
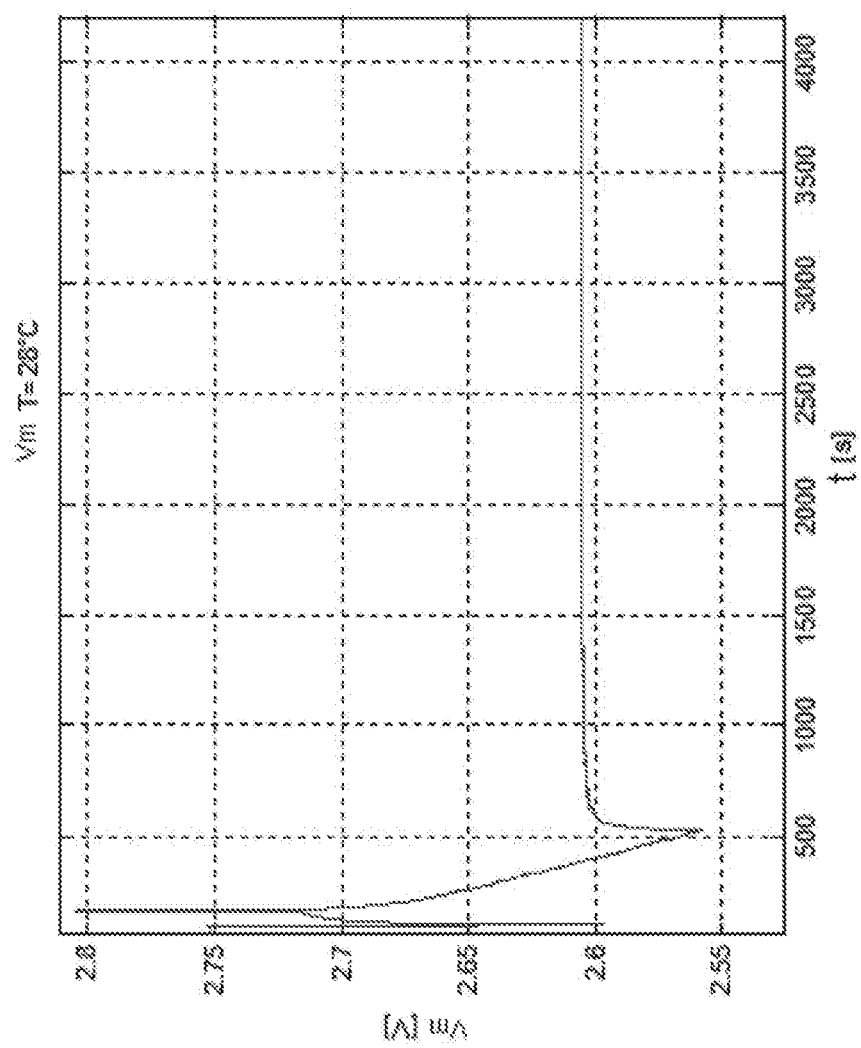
FIGS. 5A and 5B show enlarged details of a part of the charts of FIGS. 4A and 4B, respectively.
Figure 5B:
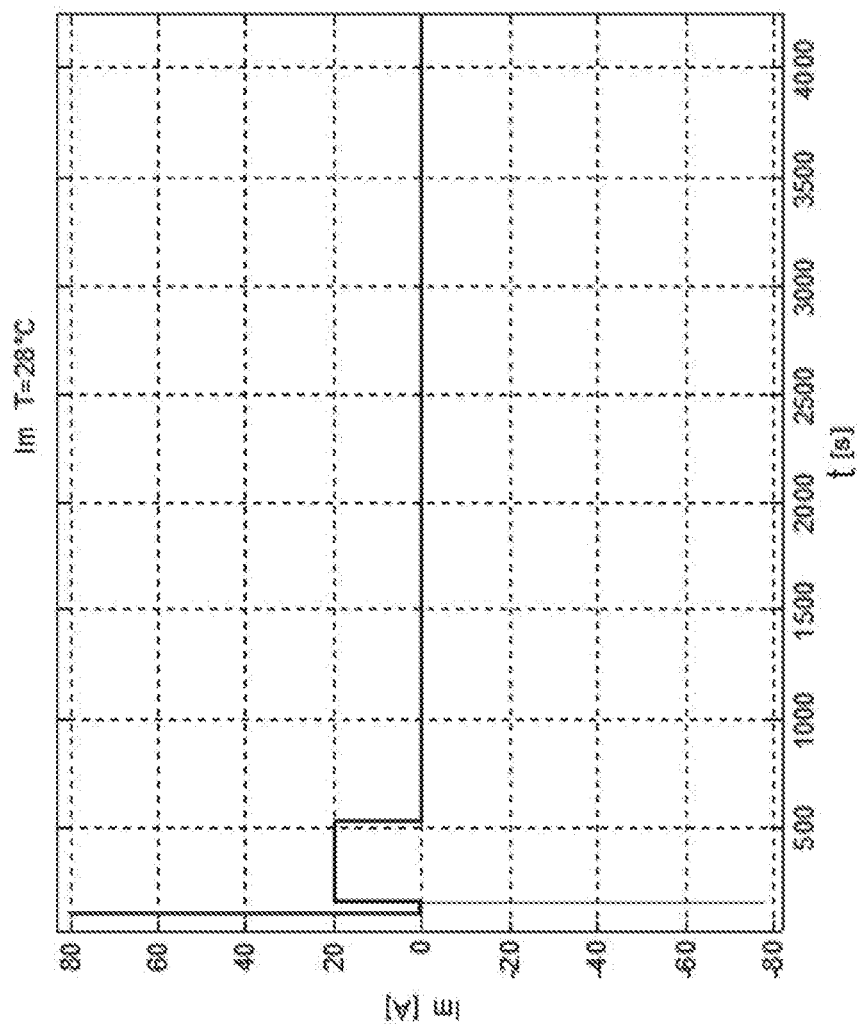

An enlargement of the first time observation window is shown in FIG. 5A, for the characterization voltage Vm, and in FIG. 5B, for the characterization current Im.

The next stage is to calculate the state of charge (SOC) based on the measured current Im. The state of charge SOC may be calculated, for example, using the so-called "Coulomb Counter" technique, based on the following formula [4]:

$$SOC(t) = SOC(t_0) - 100 \int_{t_o}^{t} \frac{i(\tau)}{Q_{nom} 3600} d\tau$$

where $Q_{nom}$ is the nominal capacity of the cell (which, in the example shown, has a value of 20 Ah) evaluated at a discharge rate of 1 Coulomb.

Figure 6:
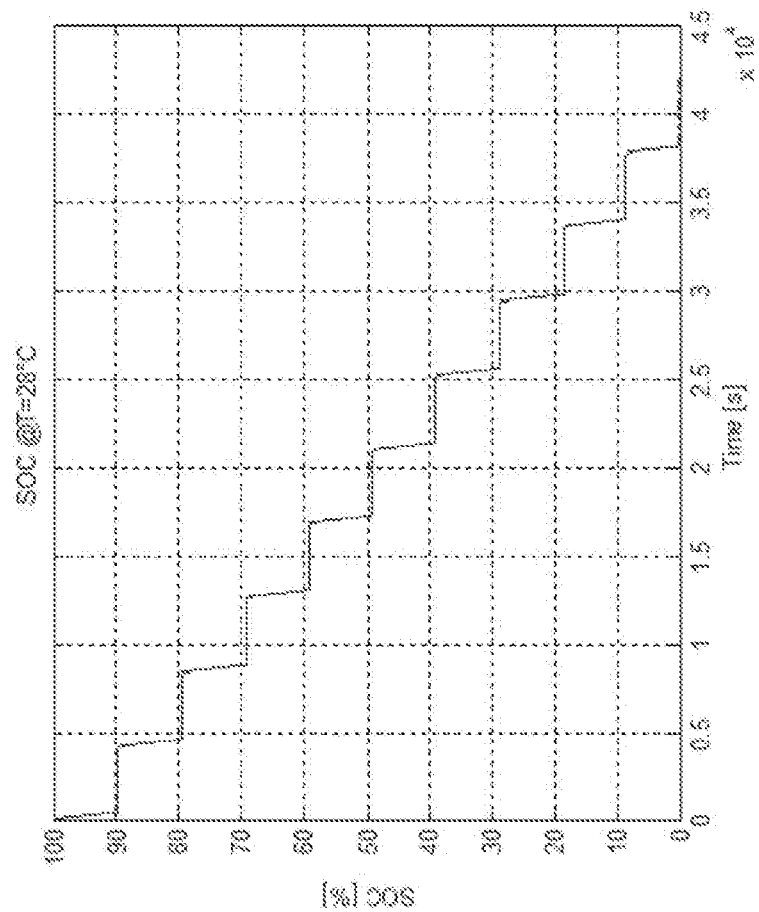
FIG. 6 shows an estimated time trend of the state of charge SOC of the battery or cell.

The state of charge SOC, calculated as a function of time, is shown in FIG. 6.

Then, the no-load voltage Voc is also calculated as a function of time. To this end, it should be noted that the initial and final points of the observation windows $W_i$ are "stationary" points, where the current is zero and therefore the voltage at the ends of the capacities $C_1$ and $C_2$ may be considered negligible. Therefore, at such points, the no-load voltage Voc coincides with the measured voltage Vm. In the other points, the calculation of the no-load voltage Voc may be performed as a linear interpolation of the function of the previously estimated state of charge SOC.

Figure 7:
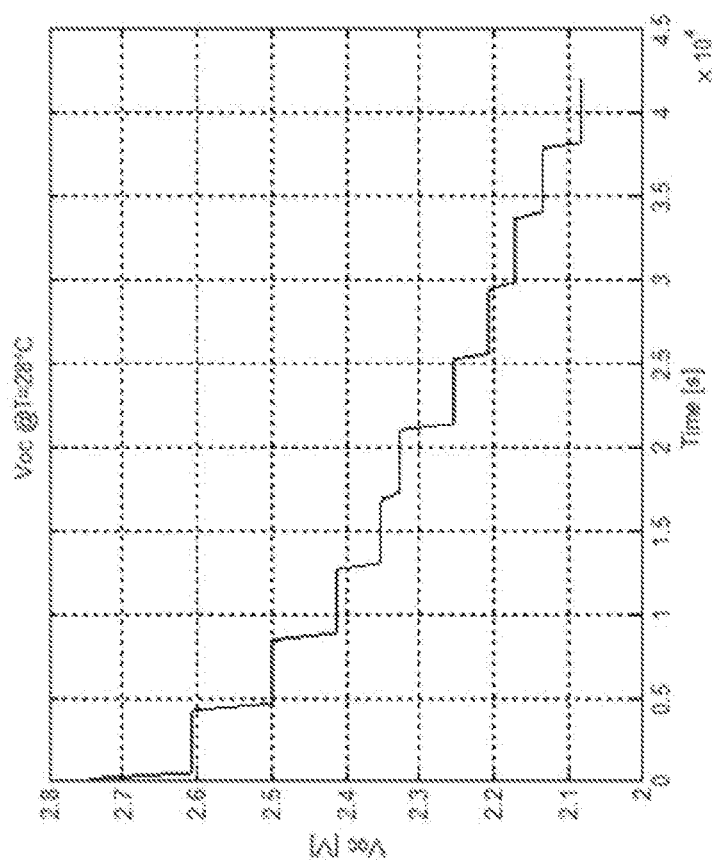
FIG. 7 shows an estimated time trend of the no-load voltage Voc of the battery or cell.

The no-load voltage Voc calculated as a function of time is shown in FIG. 7.

Figure 8:
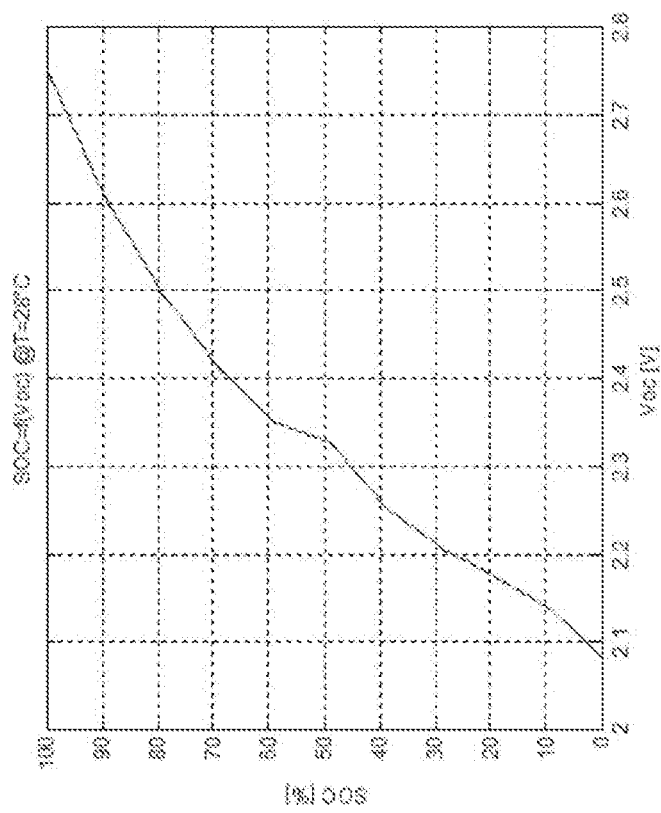
FIGS. 8 and 9 show an example of an estimated relationship between the state of charge and the no-load voltage of the battery or cell and vice versa (function and inverse function)

Based on the aforesaid information, it is possible to calculate the state of charge SOC as a function of the no-load voltage Voc, i.e., SOC=f(Voc), the diagram of which is shown in FIG. 8.

Figure 9:
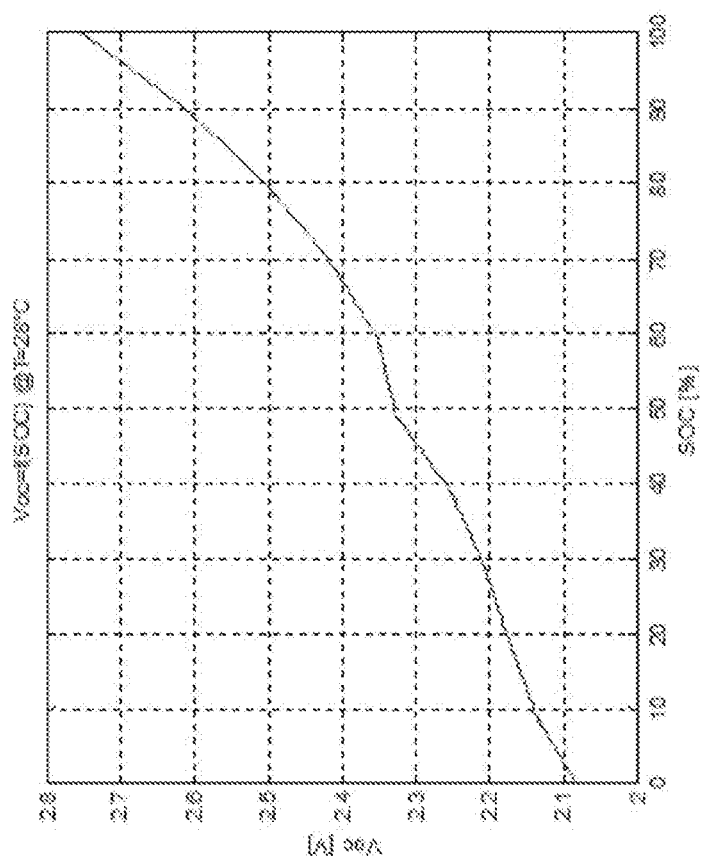

Similarly, the inverse function may be obtained, which links the no-load voltage Voc to the state of charge SOC, i.e. Voc=$f^{-1}$(SOC), the diagram of which is shown in FIG. 9.

With reference to the relationship between Voc and SOC, once the i-th observation window $W_i$ is set, the following relationship is valid:

$$V_{OCi} = (SOC_i - SOC_2) \cdot \frac{(V_{OC2} - V_{OC1})}{(SOC_2 - SOC_1)} + V_{OC2}$$

in which the subscripts 1 and 2 respectively indicate the initial and final point of the observation window. The smaller $\Delta SOC = SOC_2 - SOC_1$ is, the more accurate is such approximate relationship.

At this point, it is possible to obtain the remaining circuit parameters ($R_0, R_1, R_2, C_1, C_2$): in each observation window $W_i$, the model is stimulated with the respective measured current $Im_i$, and the combination of the aforesaid five circuit parameters is determined, such as to minimize the error between the measured voltage Vm and the voltage $V_{AB}$ estimated by the model.

Figure 10:
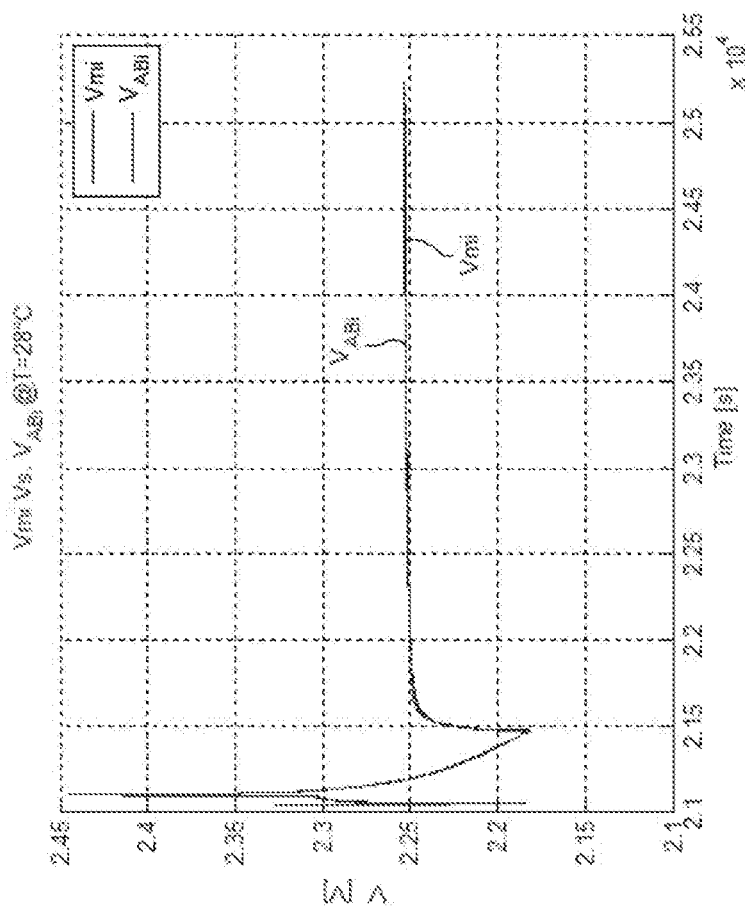
FIG. 10 shows a comparison between the charts of the voltage measured at the ends of the battery or cell and the corresponding voltage estimated by the method of the invention.

At the end of such error minimization process, the estimated voltage Vas replicates with a high degree of precision the measured characterization voltage Vm, as shown in FIG. 10 (in which, at the diagram scale, the two voltages are practically indistinguishable).

Figure 11:
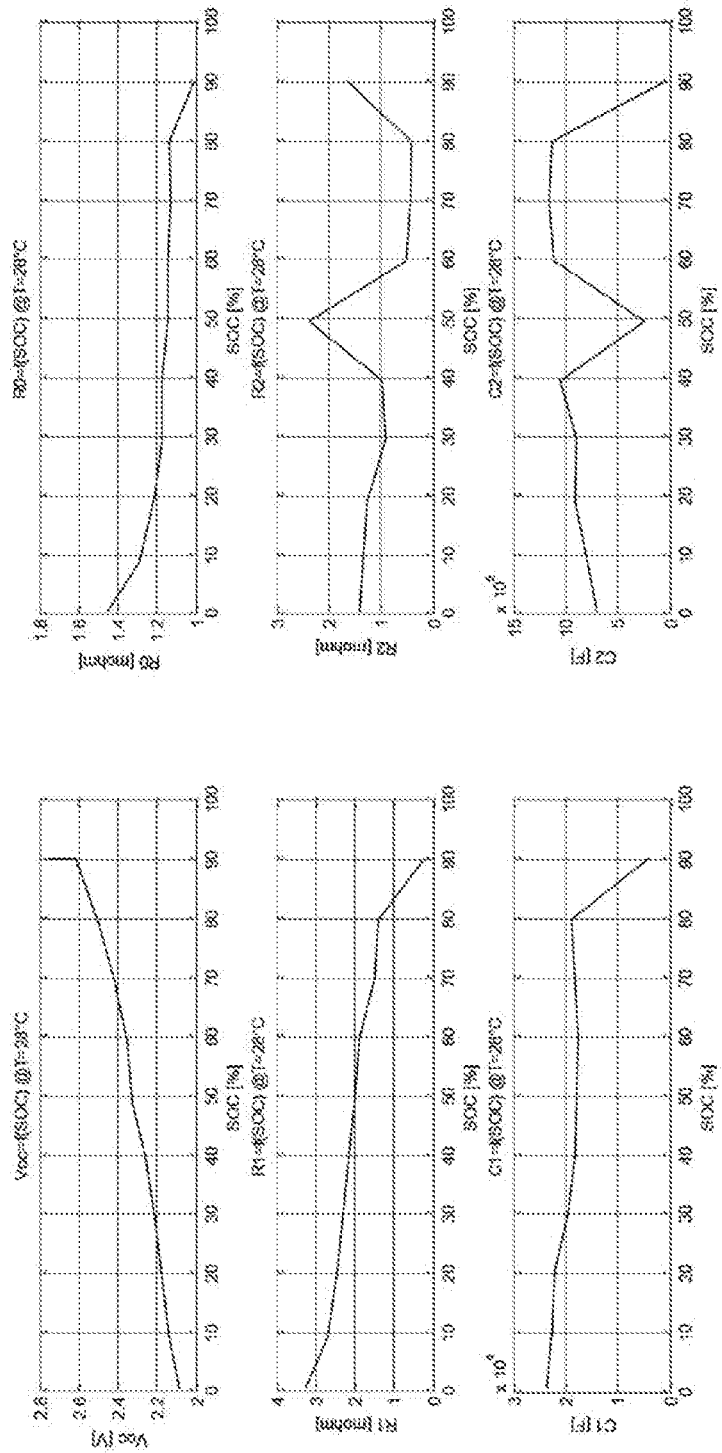
FIG. 11 shows the value of circuit parameters of the battery or cell (related to a possible model of battery or cell used in the method) as a function of the state of charge, as estimated in an exemplary embodiment by the method.

At the end of the processing procedure relating to the characterization temperature $T_k$ (in the specific case, 28° C.) all the parameters of the model are obtained as a function of the state of charge SOC, as shown in the diagrams of FIG. 11.

The processing procedure is iterated for a plurality of characterization temperatures $T_k$: ideally, the procedure may be performed for any number of temperature values.

At the end of the entire procedure, therefore, the value of each of the circuit parameters of the model of the battery pack or cell is available as a function of the value of the state of charge SOC and as a function of different operating temperature values.

The results of the processing procedure may be collected and stored in the form of "look-up tables".

In fact, according to an embodiment of the method, the processing further comprises the step of storing, on electronic storage medium (accessible to the battery pack or cell under operating conditions), the parameters P of the operating model of the battery pack or cell as look-up tables adapted to receive, as input, temperature and state of charge values, and to provide, as output, the respective values of parameters P.

In such case, according to an embodiment of the method, the step of estimating the operating current of the battery pack or cell is performed by an electronic processor associated with the battery pack or cell, adapted to access the aforesaid stored look-up tables and to receive, as input, measured operating voltage V and operating temperature T values originating from respective sensors embedded in the battery pack or cell.

In the present description, the step of acquiring characterization data of the battery pack or cell must be understood, in a broad sense, as making such data available, following a pre-characterization phase which may be performed in many different ways, including those described in the embodiments set forth here below, by way of non-limiting example.

In a possible embodiment of the method, the step of acquiring characterization data of the battery pack or cell comprises measuring, before using the battery pack or cell under operating conditions, the time trends of the characterization voltage Vm and of the characterization current Im of the battery pack or cell, at the respective characterization temperature $T_k$ value.

In another possible embodiment of the method, the step of acquiring characterization data of the battery pack or cell comprises acquiring characterization data from characterization procedures performed prior to the use under operating conditions of the battery pack or cell.

In a further possible embodiment of the method, the step of acquiring characterization data comprises deriving the characterization data from the available data sheets of the battery pack or cell.

Once the parameters of the battery pack or cell operating model have been determined, taking into account both the temperature and the state of charge of the battery or cell, as previously described, it is possible to estimate the operating current I of the battery pack or cell.

This may be done, for example, based on the following equation [5]:

$$I = \frac{V_{OC} - V_m - R_1 \cdot I_{R_1} - R_2 \cdot I_{R_2}}{R_0}$$

in which:

$$I_{R_1} = I - \frac{d(C_1 \cdot R_1 \cdot I_{R_1})}{dt} \quad I_{R_2} = I - \frac{d(C_2 \cdot R_2 \cdot I_{R_2})}{dt}$$

Discretizing the subsequent stages of the iteration (step: $T_s$), the following formulas are obtained:

$$I_{R_1} = \frac{T_s \cdot I_{old} + C_1 \cdot R_1 \cdot I_{R_{1_{old}}}}{T_s + (C_1 - C_{1_{old}}) \cdot R_1 + (R_1 - R_{1_{old}}) \cdot C_1 + C_1 \cdot R_1}$$

$$I_{R_2} = \frac{T_s \cdot I_{old} + C_2 \cdot R_2 \cdot I_{R_{2_{old}}}}{T_s + (C_2 - C_{2_{old}}) \cdot R_2 + (R_2 - R_{2_{old}}) \cdot C_2 + C_2 \cdot R_2}$$

in which, with the subscript $_{OLD}$, the values of I, $I_{R1}$, $I_{R2}$, $C_1$, $C_2$, $R_1$ and $R_2$ obtained from the previous stage $T_S$ of the iteration are indicated.

The previously described embodiments of the method allow to take into account, in an appropriate manner, the state of charge of the battery pack or cell and the operating temperature, so as to obtain reliable estimates of the battery pack or cell current, in any operating condition, and without need to detect such current directly.

A further cause of deviation of the estimate from the actual value of the current may derive from the degradation and/or aging of the battery or cell and the components thereof.

In fact, the parameters of the circuit model are valid when the battery or cell is new or at the time when the characterization is carried out. The dependence of such parameters on the state of charge and the temperature changes over time due to the degradation of the battery or cell. Therefore, strictly speaking, the characterization should be performed periodically, but this is not easy, or even not feasible, after the battery pack or cell has been mounted inside a hybrid or electric vehicle.

To address such aspect, and try to correctly estimate the modeling parameters, also taking into account factors related to aging and degradation, a further embodiment of the method provides for the following further steps.

Firstly, a thermal model of the battery pack or cell is defined, in addition to the aforementioned operating model.

Then, upon at least one measurement time interval ($t_0$-$t_1$), the dissipated electric power $P_e$ is estimated using the operating model of the battery pack or cell, based on the values, measured in such interval ($t_0$-$t_1$) of the voltage V and temperature $T_c$ of the battery pack or battery cell, and based on the parameters P estimated at the aforesaid temperature $T_c$ of the battery pack or battery cell.

Furthermore, at the same measurement time interval ($t_0$-$t_1$), the dissipated thermal power $P_d$ is estimated using the thermal model of the battery pack or cell, based on the aforesaid value of the temperature $T_c$ of the battery pack or battery cell and based on an ambient temperature $T_e$ value, measured in such interval ($t_0$-$t_1$) and based on the parameters P estimated at the temperature $T_c$ of the battery pack or battery cell.

The step is then carried out to determine a difference ΔP between the dissipated electric power $P_e$ and the dissipated thermal power $P_d$ previously estimated.

Finally, the parameters P are corrected based on the aforesaid estimated difference ΔP, so as to obtain updated values of the parameters P, such to take into account degradation and/or aging phenomena.

According to an embodiment of the method, a thermal model of the battery pack or cell is used, consisting of one or more thermal cell models, in which each thermal cell model is characterized by a thermal cell capacity $C_T$, a thermal cell resistance $R_T$, a cell temperature $T_C$ and an ambient temperature $T_e$.

The thermal cell capacity $C_T$ and thermal cell resistance $R_T$ parameters are specific to the cell and to the particular configuration of the battery pack or cell.

Figure 12:
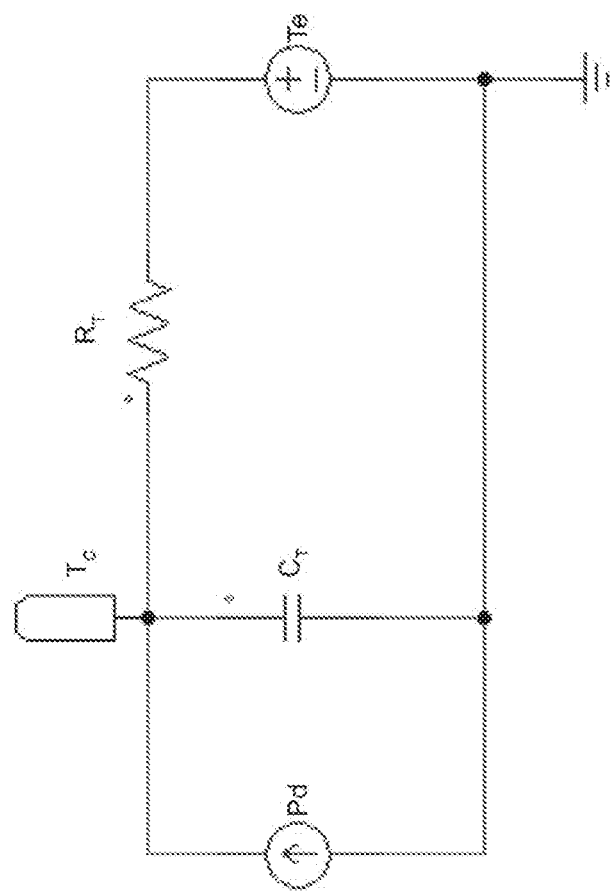
FIG. 12 shows a diagram of a thermal model of the battery or cell, adopted in an embodiment of the method in accordance with the invention.

In particular, an example of a thermal model used in the method is a first order thermal model, such as the one diagrammatically shown in FIG. 12.

In accordance with such thermal model, the following relationship [6] is valid:

$$P_d = C_T \cdot \frac{dT_C}{dt} + \frac{T_C - T_e}{R_T}$$

in which the meaning of the parameters has already been described above.

The thermal energy $E_T$ dissipated in the time interval ($t_0$-$t_1$) may be calculated using the following formula [7]:

$$E_T = C_T \cdot (T_C(t_1) - T_C(t_0)) + \frac{1}{R_T} \int_{t_0}^{t_1} (T_C - T_e) dt$$

At this point, having available the energy and/or thermal and electric power dissipated in a given time interval, the value of the parameters can be updated.

Figure 13:
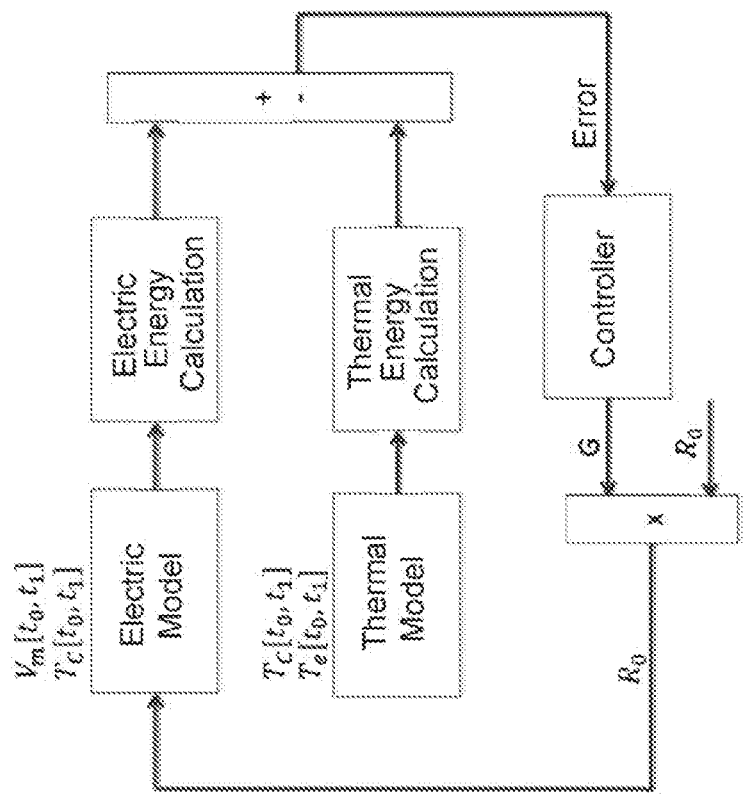
FIG. 13 is a block diagram of an algorithm for correcting and updating the parameters, as a function of degradation and/or aging, employed in an embodiment of the method.

In particular, according to an embodiment shown in the block diagram of FIG. 13, the aforesaid step of correcting the model parameters comprises the correction of the internal resistance $R_0$ parameter starting from the value determined in the absence of degradation, as previously described.

To this end, a correction factor G is determined, based on the difference $\Delta P$ between the estimated electric power and the estimated thermal power; then, the battery or cell internal resistance $R_0$ value, valid in the absence of degradation, is multiplied by the aforesaid correction factor G to obtain an updated estimate of the battery or cell internal resistance $R_0$.

It is then provided the step of recalculating the electric power $P_e$ based on the updated estimate of the internal resistance $R_0$, and then of iterating the aforesaid steps of determining, multiplying and recalculating, until the difference $\Delta P$ is reduced below a predetermined threshold. Finally, the updated estimate obtained at the end of the aforesaid iteration is considered as the internal resistance $R_0$ value of the battery or cell.

An alternative embodiment of the method, also aimed at estimating the electric operating parameters of the battery or cell in the presence of degradation and/or aging, comprises the steps of characterizing, before using the battery pack or cell under operating conditions, the change of the value of the internal resistance $R_0$ of the battery or cell as a function of the time of use and for different temperature values, and of storing the characterization data of the internal resistance of the battery or cell.

Furthermore, when the method is applied under operating conditions of the battery pack or cell, a corrected value of the internal resistance $R_0$ of the battery or cell is used, according to the aforesaid characterization data of the internal resistance $R_0$ of the battery or cell, taking into account the elapsed time of actual use of the battery pack or cell.

The present invention also comprises a method for estimating the state of charge SOC of a battery pack or cell. Such method comprises the steps of estimating the operating current I dispensed by a battery pack or cell, along an operating time of the battery pack or cell, according to any one of the embodiments described above. Then, the method provides for estimating the state of charge SOC of the battery pack or cell from an initial state of charge $SOC_0$, based on the estimated time trend of the operating current I, starting from an operation start-up instant of the battery pack or cell up to a present instant.

In particular, according to an embodiment, the aforementioned formula may be used to this end [4]:

$$SOC(t) = SOC(t_0) - 100 \int_{t_0}^{t} \frac{i(\tau)}{Q_{nom} 3600} d\tau$$

Figure 14:
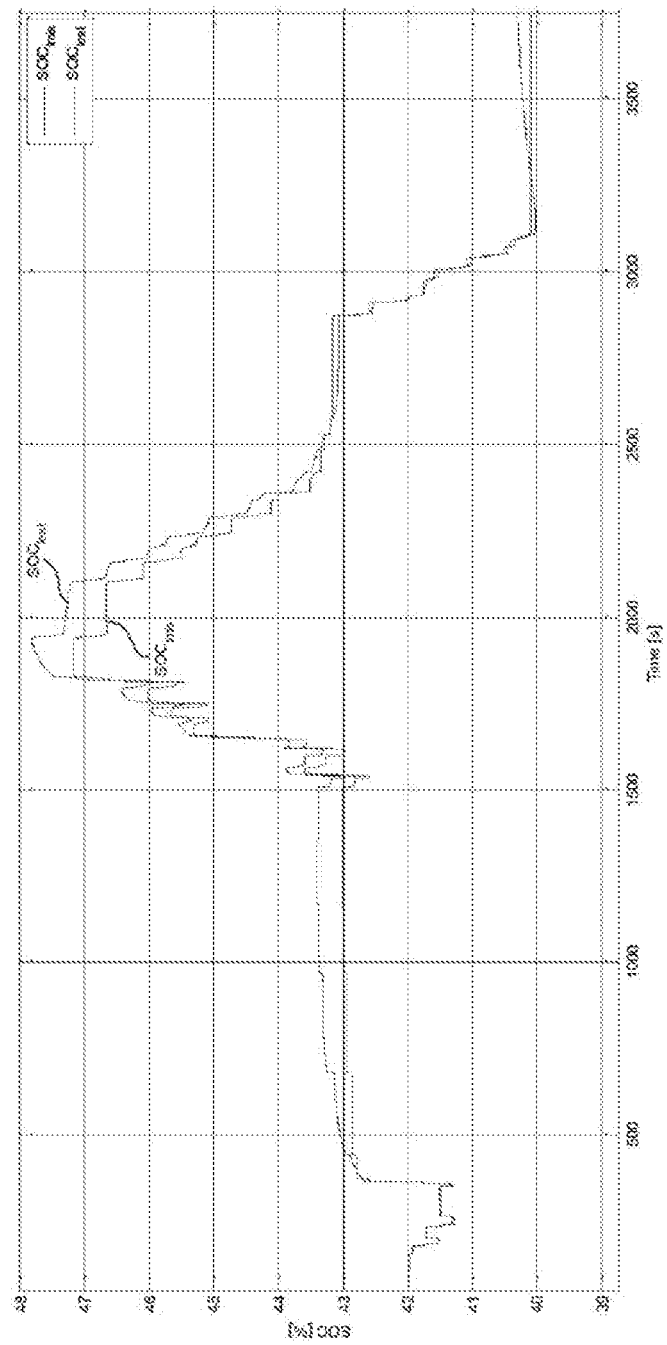
FIG. 14 shows a comparison between the charts of the state of charge deriving from a measured current of battery or cell and the state of charge deriving from a current of battery or cell, as estimated by the method of the invention.

Such method allows for an accurate estimate of the state of charge, with an error equal to or lower than 3%, as shown by way of example in FIG. 14, in which a comparison is made between the state of charge $SOC_{Imis}$ estimated by measuring the current acquired by a physical sensor and the state of charge $SOC_{Iest}$ estimated based on this method, in the absence of a physical current sensor.

Figure 15:
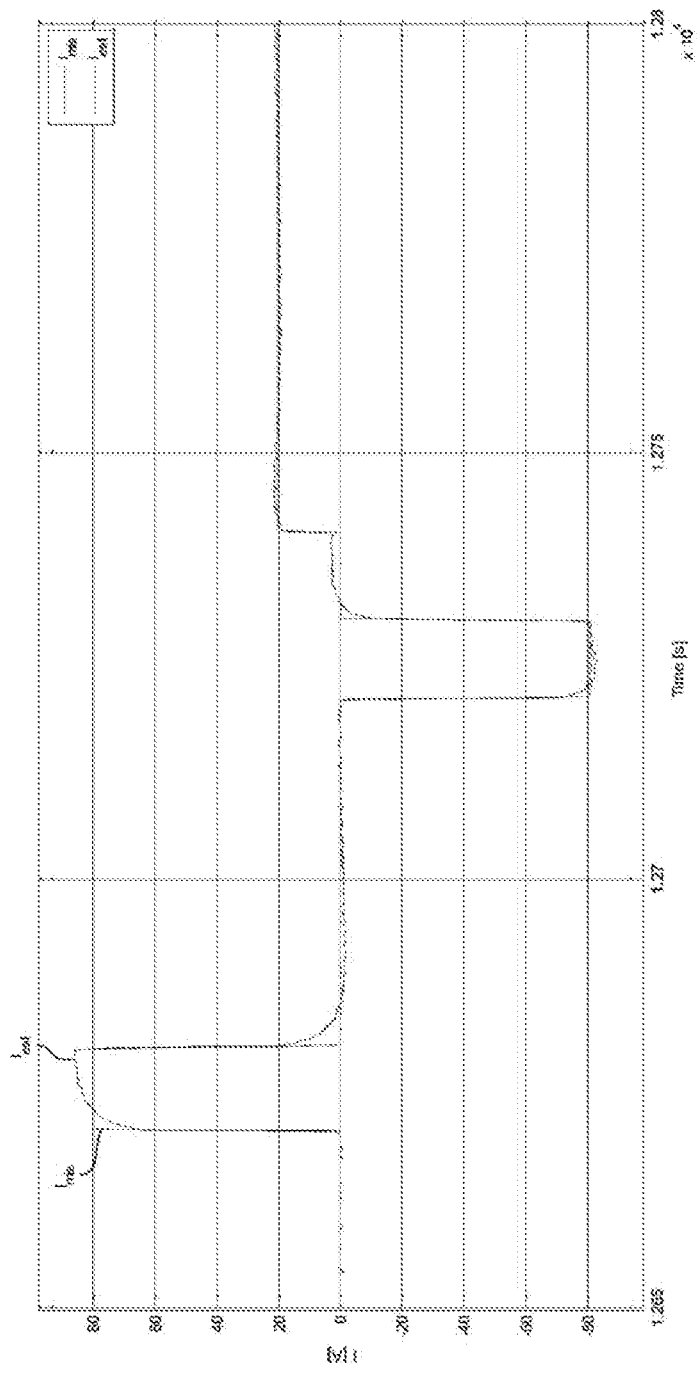
FIG. 15 shows a comparison between the charts of the measured battery or cell current and the battery or cell current estimated by the method of the invention.

In the FIG. 15, a comparison is made between the measured current $I_{mis}$ and the estimated current Is as estimated using the method of the present invention. As it may be noted, a high degree of accuracy is obtained, which may be equal to or lower than 5%.

The present invention further comprises a battery pack or cell control device that controls the battery pack or cell even in the absence of an integrated current sensor, the device being adapted to receive a measured operating voltage V value of the battery pack or cell and a measured operating temperature T value of the battery pack or cell.

The device comprises an electronic processor to perform a method for estimating the operating current I of the battery pack or cell, according to any of the embodiments described above, and/or to perform a method for estimating the state of charge SOC of the battery pack or cell according to any one of the embodiments described above.

The present invention further comprises a battery pack or cell that operates without being equipped with integrated current sensors.

The battery pack or cell comprises a voltage sensor, that detects an operating voltage V of the battery pack or cell; a temperature sensor, that detects an operating temperature T of the battery pack or cell; a control device according to what has been previously described.

As it may be noticed, the object of the present invention is fully achieved by the estimation methods described, by virtue of the respective operating features thereof.

In fact, the methods for estimating the current of the battery or cell and the state of charge of the battery or cell are based on a "on-line" acquisition (i.e., while the battery or cell is under operating conditions) of the voltage of the battery or cell and the temperature only, without requiring the direct acquisition of the current of the battery or cell using appropriate sensors.

This further allows to eliminate the current sensors from the battery pack or cell (and also to eliminate the corresponding wiring, the hardware system for acquiring current signals and the relevant software management) leading to obvious advantages in terms of reducing complexity and costs.

It should be noted that, even if the present method was used in the presence of a physical current sensor, providing a way for obtaining an additional indirect estimate of the current, the employment of this method would anyway provide, as a side benefit, the possibility of making estimates of congruence or plausibility, useful in the context of safety (ISO26262 standard).

Furthermore, as previously described in detail, the methods for estimating the current of the battery or cell and the state of charge of the battery or cell allow to obtain estimates sufficiently accurate so as to be practically used effectively: in particular, the methods described allow to estimate the instantaneous current flowing through the battery pack or cell with an error lower than 5%, and to estimate the state of charge with an error lower than 3%.

Similar advantages may be identified with reference to the control device in accordance with the invention, which performs the aforesaid estimation methods, and to the battery pack or cell in accordance with the invention which, benefiting from such estimation methods, may be devoid of current sensors, using the device and the control system.

A skilled person in the field, in order to satisfy contingent needs, may modify, adapt and replace elements with other functionally equivalent to the embodiments of the method for estimating the current, the method for estimating the state of charge, the control device and the battery pack or cell described above, without departing from the scope of the following claims.

Each of the features described as belonging to a possible embodiment may be achieved independently from the other embodiments described. It should also be noted that the term

The invention claimed is:

1. A method for estimating an operating current (I) dispensed by a battery pack or cell, comprising the steps of:
  acquiring characterization data of the battery pack or cell, related to measured time trends of a characterization voltage (Vm) and of a characterization current (Im) of the battery pack or cell, each time trend being associated with a respective value of a plurality of characterization temperature values ($T_k$);
  processing said characterization data to determine a plurality of parameters (P) of an operating model of the battery pack or cell, as a function of temperature and state of charge (SOC) of the battery pack or cell;
  while the battery pack or cell is under operating conditions, measuring an operating voltage (V) of the battery pack or cell and an operating temperature (T);
  estimating the operating current (I) of the battery pack or cell, by using said operating model, based on the measured operating voltage (V), on the measured operating temperature (T) and on said plurality of parameters (P);
  wherein the processing step comprises the following stages, performed for each value of said plurality of characterization temperature values ($T_k$):
  identifying a plurality of time observation windows ($W_i$) along the respective time trends of the characterization voltage (Vm) and of the characterization current (Im), associated with the characterization temperature ($T_k$), and detecting the respective characterization current ($Im_i$) and characterization voltage ($Vm_i$) values;
  at each observation window ($W_i$), calculating a respective value of the state of charge ($SOC_i$) of the battery pack or cell;
  at each observation window ($W_i$), calculating a respective estimated voltage ($V_{ABi}$), by using the operating model of the battery pack or cell, as a function of respective nominal values of the parameters (P), and determining a respective error function ($E_i$) dependent on the difference between the estimated voltage ($V_{ABi}$) and the characterization voltage ($Vm_i$) of the time observation window ($W_i$);
  at each observation window ($W_i$), calculating an actual value ($P_i$) for each of the plurality of parameters (P) of the model of the battery pack or cell, by minimizing said error function ($E_i$);
  associating the actual values ($P_i$) of the parameters calculated at the observation windows ($W_i$) with the respective state of charge ($SOC_i$) and characterization temperature ($T_k$), to obtain said plurality of parameters (P) as a function of temperature and state of charge of the battery pack or cell;
  defining a thermal model of the battery pack or cell;
  in at least one measurement time interval, estimating the dissipated electric power ($P_e$) using the operating model of the battery pack or cell, based on the values, measured in said interval, of the voltage (V) and temperature ($T_e$) of the battery pack or battery cell, and based on the parameters (P) corresponding to said temperature ($T_e$) of the battery pack or battery cell;
  at the same at least one measurement time interval, estimating the dissipated thermal power ($P_d$) using the thermal model of the battery pack or cell, based on said temperature value ($T_c$) of the battery pack or battery cell and based on an ambient temperature value ($T_e$), both temperature values being measured in said interval, and based on the parameters (P) corresponding to said temperature ($T_e$) of the battery pack or battery cell;
  determining a difference ($\Delta P$) between the dissipated electric power ($P_e$) and the dissipated thermal power ($P_d$) estimated; and
  correcting the parameters (P) according to said estimated difference ($\Delta P$), so as to obtain corrected values of the parameters (P) which take into account degradation and/or aging phenomena.

2. The method as set forth in claim 1, wherein the operating model of the battery pack or cell is an electric circuit model and the model parameters comprise electric circuit parameters.

3. The method as set forth in claim 2, wherein the processing step further comprises:
  determining a respective no-load voltage ($Voc_i$) value of the battery pack or cell, at each observation window ($W_i$);
  defining a relationship between no-load voltage (Voc) and state of charge (SOC) of the battery pack or cell, based on the plurality of no-load voltages ($Voc_i$) and state of charge ($SOC_i$) values obtained at the observation windows ($W_i$);
  and wherein, in each observation window ($W_i$), the step of calculating the actual value ($P_i$) of the parameters also takes into account the respective no-load voltage ($Voc_i$) value and said relationship between no-load voltage (Voc) and state of charge (SOC) of the battery pack or cell.

4. The method as set forth in claim 3, wherein the step of identifying a plurality of observation windows ($W_i$) comprises identifying time windows where the characterization current (Im) is zero, upon the exhaustion of transient phenomena, and where, consequently, the no-load voltage ($Voc_i$) corresponds to the characterization voltage ($Vm_i$).

5. The method as set forth in claim 1, wherein the step of calculating a respective value of the state of charge ($SOC_i$) of the battery pack or cell comprises:
  calculating the respective value of the state of charge ($SOC_i$) of the battery pack or cell based on the time trend of the characterization current.

6. The method as set forth in claim 2, wherein the electric circuit model of the battery pack or cell comprises a no-load voltage (Voc) generator and the series of a battery or cell internal resistance ($R_0$) and one or more circuit groups, each comprising the parallel of a respective circuit group resistance and a respective circuit group capacity,
  and wherein the group of circuit parameters P comprises no-load voltage (Voc), battery or cell internal resistance ($R_0$), one or more circuit group resistances ($R_1$, $R_2$), and one or more circuit group capacities ($C_1$, $C_2$).

7. The method as set forth in claim 6, wherein the electric circuit model of the battery pack or cell comprises two circuit groups, and wherein the group of circuit parameters P comprises a first circuit group resistance ($R_1$), a first circuit group capacity ($C_1$), a second circuit group resistance ($R_2$), a second circuit group capacity ($C_2$).

8. The method as set forth in claim 1, wherein the operating model of the battery pack or cell comprises a trained predictive algorithm, and the parameters (P) are parameters of the trained predictive algorithm, and wherein the step of determining the plurality of parameters (P) comprises training the predictive algorithm according to the acquired battery pack or cell characterization data.

9. The method as set forth in claim 1, wherein the step of acquiring characterization data of the battery pack or cell comprises:
measuring, before using the battery pack or cell under operating conditions, the time trends of the characterization voltage (Vm) and of the characterization current (Im) of the battery pack or cell, at the respective characterization temperature ($T_k$) value,
or
acquiring characterization data from characterization procedures performed prior to the use under operating conditions of the battery pack or cell.

10. The method as set forth in claim 1, wherein the processing step further comprises:
storing, on electronic storage medium accessible to the battery pack or cell under operating conditions, the parameters (P) of the operating model of the battery pack or cell as look-up tables adapted to receive, as input, temperature and state of charge values, and to provide the respective values of parameters (P).

11. The method as set forth in claim 10, wherein the step of estimating the operating current of the battery pack or cell is performed by an electronic processor associated with the battery pack or cell, adapted to access said stored look-up tables and to receive, as input, measured operating voltage (V) and operating temperature (T) values from respective sensors embedded in the battery pack or cell.

12. The method as set forth in claim 1, wherein the thermal model of the battery pack or cell consists of one or more thermal cell models,
each thermal cell model including a thermal cell capacity ($C_T$), a thermal cell resistance ($R_T$), a cell temperature ($T_c$) and an ambient temperature ($T_e$).

13. The method as set forth in claim 1, wherein the step of correcting comprises:
determining a correction factor (G) according to the difference (ΔP) between electric power and thermal power;
multiplying the value of the internal resistance ($R_0$) by said correction factor (G) to obtain an updated estimate of the internal resistance ($R_0$) of the battery or cell;
recalculating the electric power ($P_e$) according to the updated estimate of the internal resistance ($R_0$) of the battery or cell;
iterating said steps of determining, multiplying, and recalculating up to reduce said difference (ΔP) below a predetermined threshold;
considering the updated estimate obtained at the end of said iteration as the internal resistance ($R_0$) value of the battery or cell.

14. A method for estimating the state of charge (SOC) of a battery pack or cell, said method comprising the steps of:
estimating the operating current (I) dispensed by a battery pack or cell, along an operating time of the battery pack or cell, as set forth in claim 1;
estimating the state of charge (SOC) of the battery pack or cell from an initial state of charge ($SOC_0$), based on the estimated time trend of the operating current (I), starting from an operation start-up instant of the battery pack or cell up to a current instant.

15. A battery pack or cell control device used to control the battery pack or cell even in the absence of an integrated current sensor, the device being adapted to receive a measured operating voltage (V) value of the battery pack or cell and a measured operating temperature (T) value of the battery pack or cell, wherein the device comprises electronic processor to perform a method of estimating the battery pack or cell operating current (I), according to claim 1, and/or to carry out a method of estimating the state of charge (SOC) of the battery pack or cell according to claim 14.

16. A battery pack or cell that operates without being equipped with integrated current sensors, comprising:
a voltage sensor, that detects an operating voltage (V) of the battery pack or cell;
a temperature sensor, that detects an operating temperature (T) of the battery pack or cell;
a control device as set forth in claim 15.

17. A method for estimating an operating current (I) dispensed by a battery pack or cell, comprising the steps of:
acquiring characterization data of the battery pack or cell, related to measured time trends of a characterization voltage (Vm) and of a characterization current (Im) of the battery pack or cell, each time trend being associated with a respective value of a plurality of characterization temperature values ($T_k$);
processing said characterization data to determine a plurality of parameters (P) of an operating model of the battery pack or cell, as a function of temperature and state of charge (SOC) of the battery pack or cell;
while the battery pack or cell is under operating conditions, measuring an operating voltage (V) of the battery pack or cell and an operating temperature (T);
estimating the operating current (I) of the battery pack or cell, by using said operating model, based on the measured operating voltage (V), on the measured operating temperature (T) and on said plurality of parameters (P);
wherein the processing step comprises the following stages, performed for each value of said plurality of characterization temperature values ($T_k$):
identifying a plurality of time observation windows ($W_i$) along the respective time trends of the characterization voltage (Vm) and of the characterization current (Im), associated with the characterization temperature ($T_k$), and detecting the respective characterization current ($Im_i$) and characterization voltage ($Vm_i$) values;
at each observation window ($W_i$), calculating a respective value of the state of charge ($SOC_i$) of the battery pack or cell, and calculating a respective estimated voltage ($V_{ABi}$), by using the operating model of the battery pack or cell, as a function of respective nominal values of the parameters (P), and determining a respective error function ($E_i$) dependent on the difference between the estimated voltage ($V_{ABi}$) and the characterization voltage ($Vm_i$) of the time observation window ($W_i$), as well as calculating an actual value ($P_i$) for each of the plurality of parameters (P) of the model of the battery pack or cell, by minimizing said error function ($E_i$);
associating the actual values ($P_i$) of the parameters calculated at the observation windows ($W_i$) with the respective state of charge ($SOC_i$) and characterization temperature ($T_k$), to obtain said plurality of parameters (P) as a function of temperature and state of charge of the battery pack or cell;
wherein the operating model of the battery pack or cell is an electric circuit model and the model parameters comprise electric circuit parameters;
wherein the electric circuit model of the battery pack or cell comprises a no-load voltage (Voc) generator and the series of a battery or cell internal resistance ($R_0$) and one or more circuit groups, each comprising the parallel of a respective circuit group resistance and a respective circuit group capacity; and wherein the group of circuit parameters P comprises no-load voltage (Voc), battery or cell internal resistance ($R_0$), one or more circuit group resistances ($R_1$, $R_2$), and one or more circuit group capacities ($C_1$, $C_2$).

18. The method as set forth in claim 17, comprising the further steps of:

characterizing, before using the battery pack or cell under operating conditions, the change of the value of the battery or cell internal resistance ($R_0$), as a function of the time of use and for different temperature values;

storing the characterization data of the internal resistance;

when the method is applied, under operating conditions of the battery pack or cell, using a corrected value of the internal resistance ($R_0$) of the battery or cell, according to said characterization data of the internal resistance ($R_0$) of the battery or cell, taking into account the elapsed time of actual use of the battery pack or cell.

* * * * *